(12) United States Patent
Chen et al.

(10) Patent No.: US 7,682,942 B2
(45) Date of Patent: Mar. 23, 2010

(54) METHOD FOR REDUCING PILLAR STRUCTURE DIMENSIONS OF A SEMICONDUCTOR DEVICE

(75) Inventors: Yung-Tin Chen, Santa Clara, CA (US); Michael Chan, Mountain View, CA (US); Paul Poon, Fremont, CA (US); Steven J. Radigan, Fremont, CA (US)

(73) Assignee: Sandisk 3D LLC, Milpitas, CA (US)

( * ) Notice: Subject to any disclaimer, the term of this patent is extended or adjusted under 35 U.S.C. 154(b) by 122 days.

(21) Appl. No.: 11/864,205

(22) Filed: Sep. 28, 2007

(65) Prior Publication Data

US 2009/0087963 A1  Apr. 2, 2009

(51) Int. Cl.
H01L 21/20 (2006.01)
H01L 21/36 (2006.01)

(52) U.S. Cl. ................................. 438/478; 257/613

(58) Field of Classification Search .................. None
See application file for complete search history.

(56) References Cited

U.S. PATENT DOCUMENTS

| | | | |
|---|---|---|---|
| 6,221,562 B1 * | 4/2001 | Boyd et al. | 430/314 |
| 6,492,075 B1 * | 12/2002 | Templeton et al. | 430/5 |
| 6,952,030 B2 | 10/2005 | Herner et al. | |
| 2002/0172901 A1 * | 11/2002 | Tokushima | 430/394 |
| 2002/0182549 A1 | 12/2002 | Chang et al. | |
| 2005/0052915 A1 * | 3/2005 | Herner et al. | 365/202 |
| 2005/0170294 A1 * | 8/2005 | Kobayashi | 430/330 |
| 2006/0105476 A1 * | 5/2006 | Choi et al. | 438/14 |
| 2006/0154182 A1 * | 7/2006 | Brodsky | 430/322 |

OTHER PUBLICATIONS

Ishibashi et al., Jpn. J. Appl. Phys., vol. 40, (2001) Pt. 1, No. 12.*
U.S. Appl. No. 12/222,293, filed Aug. 6, 2008, Chan.
U.S. Appl. No. 12/216,107, filed Jun. 30, 2008, Chan.
Nakamura, Hiroko, et al., "Low $k_1$ Contact Hole Formation by Double Line and Space Formation Method with Contact Hole Mask and Dipole Illumination", The Japan Society of Applied Physics, 2006, vol. 45, No. 6b, pp. 5409-5417.
Nakamura, Hiroko, et al., Contact Hole Formation by Multiple Exposure Technique in Ultra-low $k_1$ Lithography, Proceedings of SPIE, vol. 5377, 2004m pp. 255-265.
"Method for Generating Structures Smaller Than Normal Resolution Limit", IBM Technical Disclosure Bulletin, Aug. 1, 1989, vol. 32, No. 3A, pp. 420, 421.
U.S. Appl. No. 10/955,549.
U.S. Appl. No. 11/148,530.
Kim R.H. et al., "Double Exposure Using 193 Negative Tone Resist" 2007 SPIE 6520-95.

* cited by examiner

*Primary Examiner*—Ha Tran T Nguyen
*Assistant Examiner*—Shantanu C Pathak
(74) *Attorney, Agent, or Firm*—Foley & Lardner LLP (57) ABSTRACT

A method creates pillar structures on a semiconductor wafer and includes the steps of providing a layer of semiconductor. A layer of photoresist is applied over the layer of semiconductor. The layer of photoresist is exposed with an initial pattern of light to effect the layer of photoresist. The photoresist layer is then etched away to provide a photoresist pattern to create the pillar structures. The photoresist pattern is processed in the layer of photoresist after the step of exposing the layer of photoresist and prior to the step of etching to reduce the dimensions of the photoresist pattern in the layer of photoresist.

8 Claims, 8 Drawing Sheets

METHOD FOR REDUCING PILLAR STRUCTURE DIMENSIONS OF A SEMICONDUCTOR DEVICE

BACKGROUND ART

The invention generally relates to a method used to increase the density of devices formed on a semiconductor wafer. More particularly, the invention relates to a method used to reduce the dimensions of devices formed on a semiconductor wafer.

Devices made from semiconductor materials are used to create memory circuits in electrical components and systems. Memory circuits are the backbone of such devices as data and instruction sets are stored therein. Minimizing the amount of natural resources and space consumed by memory circuits is a primary motivation in the designing of such circuits. As the design of memory circuits has moved from two-dimensional designs to three-dimensional designs, more emphasis is being made to minimize the space required to build structures, while maintain the integrity and strength of same, which becomes more important as more elements are incorporated into a space, the greater the cost in having to replace that component should one element therein fail.

Electrical connections between dielectric layers and electrical components of an integrated circuit are required to be strong. Likewise, the electrical components themselves must be strong enough to endure harsh environmental conditions during continued manufacturing processes and a subsequent use life. Therefore, the connections between the electrical components and the wafer must be strong.

As the dimensions for structures formed on a semiconductor wafer diminish, tools currently available to create these devices reach their limits. By way of example, for a 32 nanometer patterning of a pillar structure, the currently available 193 nanometer immersion tools will fail to create such small devices. To use such tools, the use of which is desired to minimize the cost of tooling to fabricate the new smaller devices, additional steps are required to be introduced into the manufacturing process. One such process is double exposure/double patterning techniques.

It has been proposed to use negative resist to perform double exposure on line/space structures. Similar concepts have been applied to pillar structures by using contact mask structures to print pillar structures using a negative resist. The resolution capability of the 193 nanometer immersion tools with a negative resist lacks predictability and reliability.

SUMMARY OF THE INVENTION

A method creates pillar structures on a semiconductor wafer and includes the steps of providing a layer of semiconductor. A layer of photoresist is applied over the layer of semiconductor. The layer of photoresist is exposed with an initial pattern of light to affect the layer of photoresist. The photoresist layer is then etched away to provide a photoresist pattern to create the pillar structures. The photoresist pattern is processed in the layer of photoresist after the step of exposing the layer of photoresist and prior to the step of etching to reduce the dimensions of the photoresist pattern in the layer of photoresist.

BRIEF DESCRIPTION OF THE DRAWINGS

Advantages of the invention will be readily appreciated as the same becomes better understood by reference to the following detailed description when considered in connection with the accompanying drawings, wherein:

FIG. 5b is graphic representation of two photoresist patterns, the composite of which is the photoresist pattern of FIG. 5a;

DETAILED DESCRIPTION OF THE PREFERRED EMBODIMENT

Figure 1:
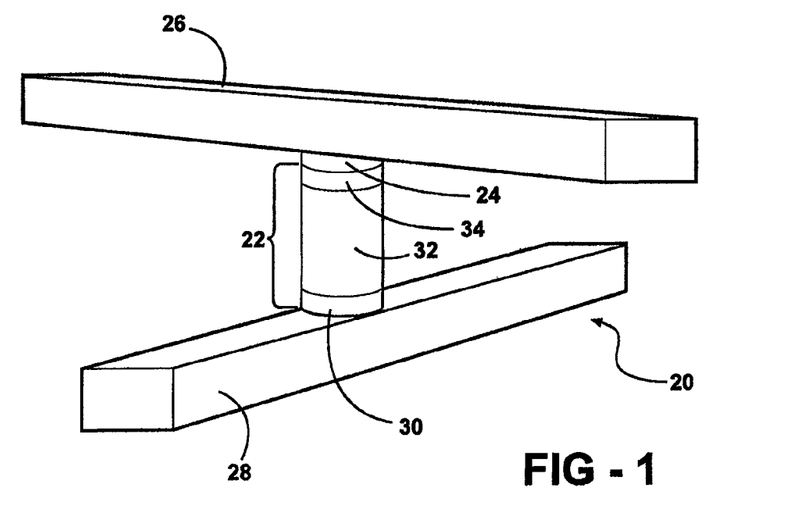
FIG. 1 is a perspective view of a nonvolatile memory cell.

Referring to FIG. 1, U.S. Pat. No. 6,952,030, issued to Herner et al. and entitled "High-Density Three-Dimensional Memory Cell," hereinafter the "'030 patent" and hereby incorporated by reference, discloses a nonvolatile memory cell, generally indicated at 20, including a vertically oriented junction diode 22 and a dielectric rupture antifuse 24 interposed between top 26 and bottom 28 conductors. The vertically oriented junction diode 22 includes a heavily doped semiconductor layer 30 of a first conductivity type, an intermediate layer 32 which is undoped semiconductor material or lightly doped semiconductor material, and a heavily doped semiconductor layer 34 of the second conductivity type. The semiconductor material of the junction diode 22 is generally silicon, germanium, or an alloy of silicon and/or germanium. The junction diode 22 and the dielectric rupture antifuse 24 are arranged in series between the bottom conductor 28 and the top conductor 26, which may be formed of a metal such as tungsten.

The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have a p-type semiconductor material and an n-type semiconductor material in contact, such as Zener diodes, and p-i-n diodes, in which an intrinsic (undoped) semiconductor material is interposed between the p-type semiconductor material and the n-type semiconductor material.

In the initial state of the memory cell 20 of FIG. 1, very little current flows through the junction diode 22 when a read voltage is applied between the top conductor 26 and the bottom conductor 28. The antifuse 24 impedes current flow, and in most embodiments, the polycrystalline semiconductor material of diode 22 is formed in a relatively high-resistive state, as described in a U.S. patent application having Ser. No. 10/955,549, "Nonvolatile Memory Cell Without a Dielectric Antifuse Having High- and Low-Impedance States," filed by Herner et al. on Sep. 29, 2004 and hereinafter the "'549 application"; and U.S. patent application having Ser. No. 11/148,530, "Nonvolatile Memory Cell Operating by Increasing Order in Polycrystalline Semiconductor Material," filed by Herner et al. on Jun. 8, 2005 and hereinafter the "'530 application," both hereby incorporated by reference. The application of a programming voltage between the top conductor 26 and bottom conductor 28 causes dielectric breakdown of the antifuse material, permanently forming a conductive path through the antifuse 24. The semiconductor material of diode 22 is altered as well, changing it to a lower-resistive state. After programming, a readily detectable current flows between the top conductor 26 and the bottom conductor 28 upon application of a read voltage. In this way, a programmed cell can be distinguished from an unprogrammed cell.

Figure 2:
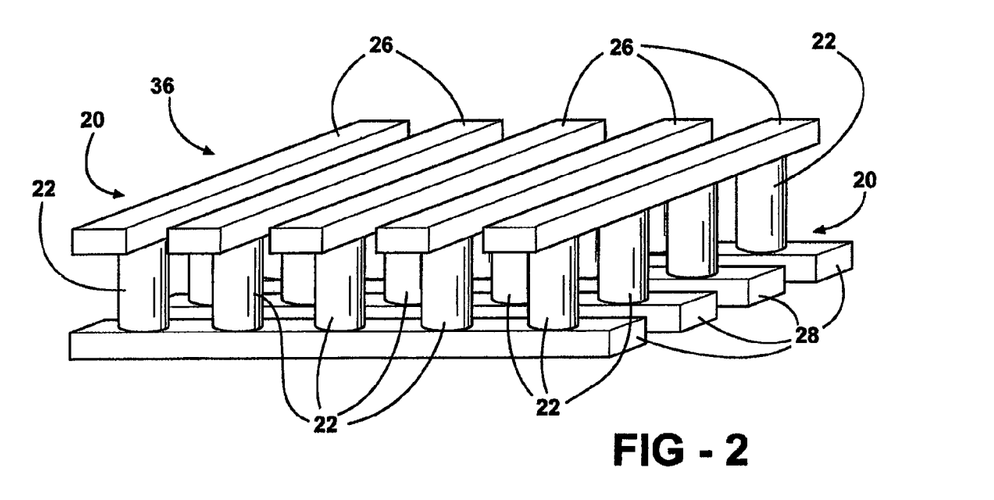
FIG. 2 is a perspective view of a portion of a first memory cell of FIG. 1.

Referring to FIG. 2, a portion of a first memory level 36 of memory cells 20 similar to the cell 20 of FIG. 1 is shown. Two, three, four, or more such memory levels may be formed, stacked one atop the other, to form a monolithic three dimensional memory array, preferably formed above a semiconductor substrate such as a monocrystalline silicon wafer, and described in the '030 patent and the '549 and '530 applications.

Features in semiconductor devices such as the memory cell 20 are generally formed either by subtractive or by Damascene methods. In a subtractive method, a material is patterned and etched into a desired shape. Gaps are then etched between features and filled with dielectric. In a Damascene method, features are formed by forming voids in dielectric, then filling those voids with conductive or semiconductor material.

Figure 3A:
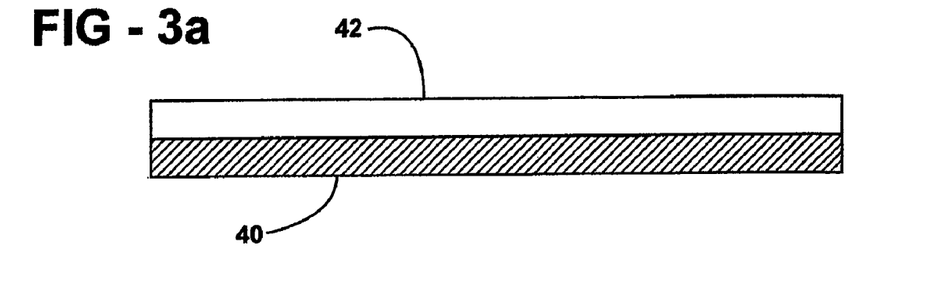
FIGS. 3a through 3d are cross-sectional side views illustrating steps in the process of forming conductive rails by a subtractive method.
Figure 3B:
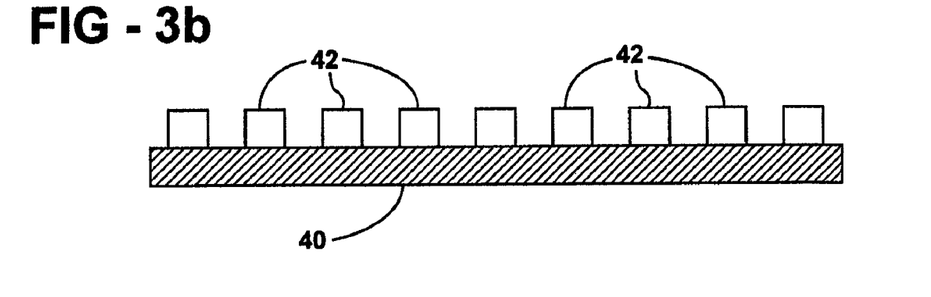
Figure 3C:
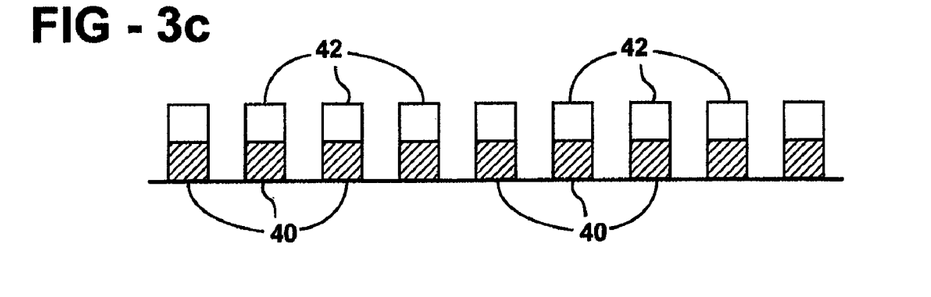
Figure 3D:
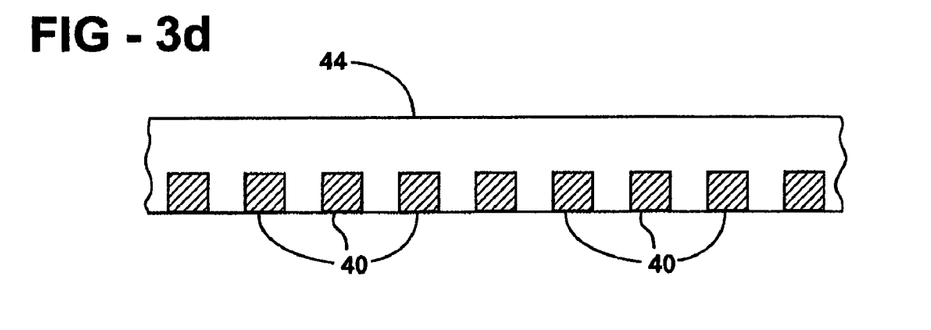

For example, to form metal rail-shaped conductors using the subtractive method, as shown in FIG. 3a, a metal layer 40 is deposited, and a layer of photoresist 42 is spun onto it. As shown in FIG. 3b, the layer of photoresist 42 is then photolithographically patterned into the desired form. As shown in FIG. 3c, an etch step removes portions of the metal layer 40 where it is not protected by etched photoresist layer 42. As shown in FIG. 3d, after the etch, the photoresist layer 42 is stripped, leaving metal rails 40 behind, with gaps between the rails 40, which can be filled by a dielectric 44. If desired, any overfill of the dielectric 44 can be removed, for example by chemical-mechanical planarization (CMP), to expose the metal rails 40 at a planarized surface.

Figure 4A:
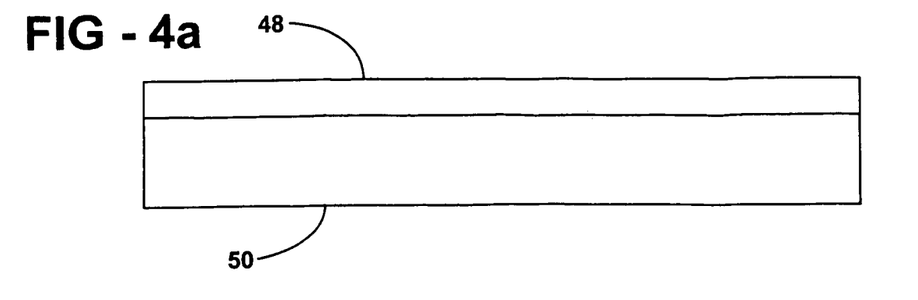
FIGS. 4a through 4d are cross-sectional side views illustrating steps in the process of forming conductive rails by a Damascene method.
Figure 4B:
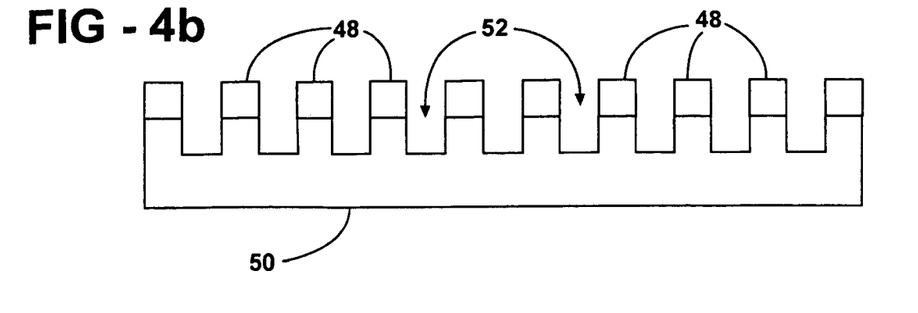
Figure 4C:
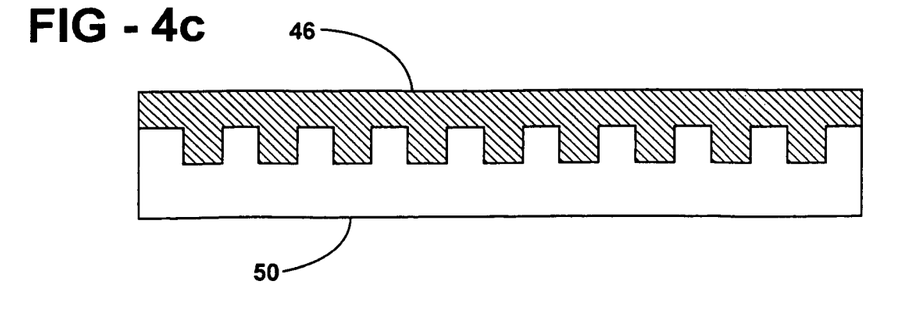
Figure 4D:
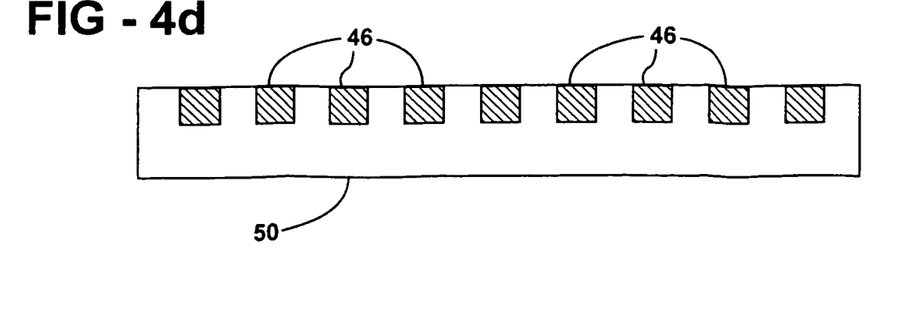

To contrast the example shown in FIGS. 3a through 3d, FIG. 4a illustrates the first step in forming metal rail-shaped conductors 46 using a Damascene method. First, a layer of photoresist 48 is spun onto a deposited oxide layer 50. As shown in FIG. 4b, the layer of photoresist 48 is patterned. An etch step then forms trenches 52 in the oxide layer 50. In FIG. 4c, after removal of the photoresist layer 48, the layer of metal 46 is deposited to fill the trenches 52, and the overfill removed, for example by CMP, to form the rails 46, shown in FIG. 4d.

In the embodiment of the '030 patent, shown in FIG. 1, the bottom conductors 28 and the top conductors 26 are formed by subtractive methods. In some embodiments, it may be desirable to form these conductors using a Damascene method.

Figure 5A:
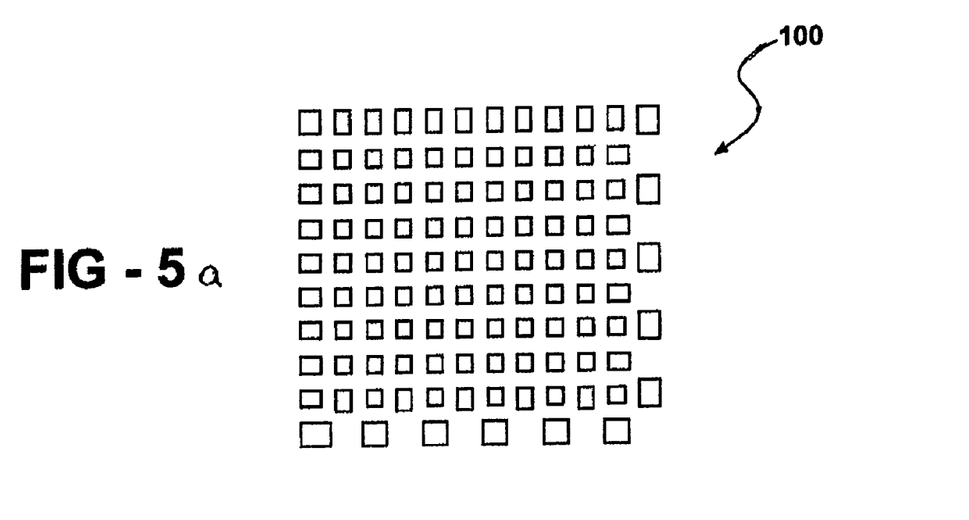
FIG. 5a is a top view of a desired photoresist pattern.

Referring to FIG. 5a, a graphic representation of a desired mask configuration is generally shown at 100. The mask configuration 100 has a "topography" that is very dense, i.e., there are many structures that are spaced very close together. In this embodiment, it is contemplated that the pattern for the desired mask configuration 100 is characterized as a 32 nanometer topography or pattern. As stated above, the desired mask configuration 100 is unattainable using the current tools available as those emersion tools reach their limit at approximately 45 nanometers.

Figure 5B:
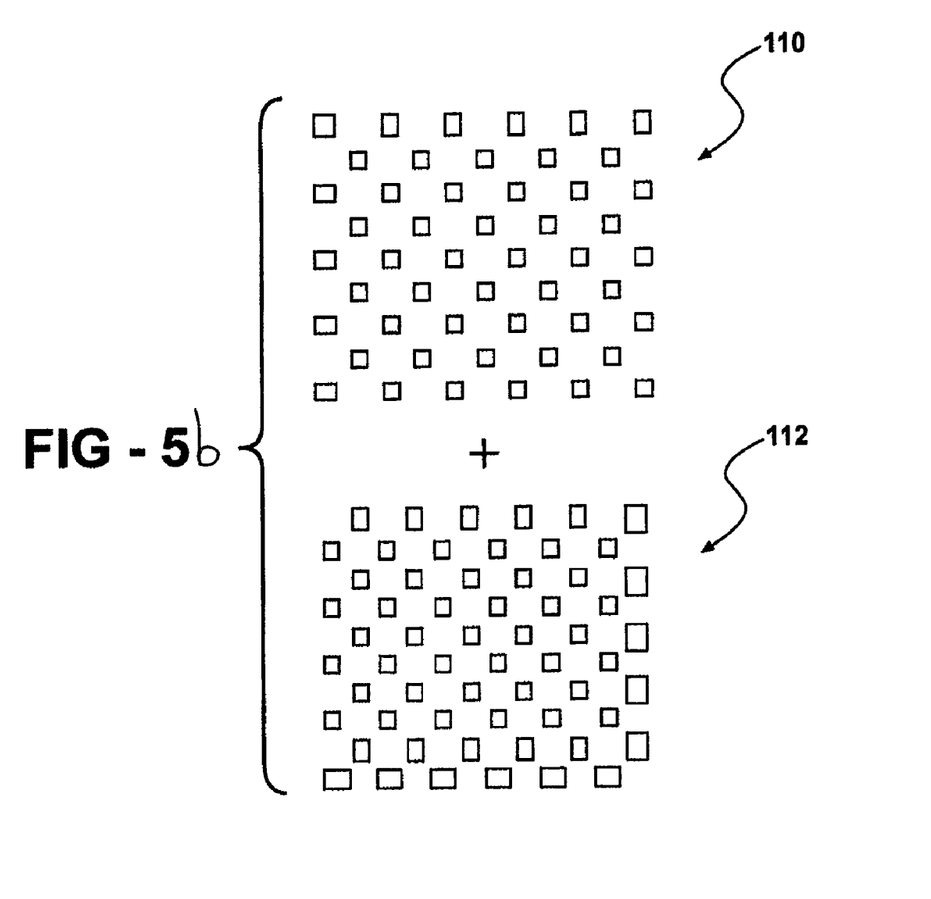

Part of the solution incorporates the use of a double exposure. Referring to FIG. 5b, the double exposure is performed by using two separate mask configurations 110, 112. The first mask configuration 110 is used during the first exposure, whereas the second mask configuration 112 is used during the second exposure. In the embodiment shown in FIG. 5b, the first mask configuration 110 and the second mask configuration 112 are different. It is contemplated that a single mask configuration could be used for both exposures of light to the photoresist (discussed subsequently). In this instance where a single mask configuration is used, the mask is moved spatially between exposures to effect a two mask configuration simulation. If portions of the mask are unique, however, a first 110 and second 112 mask configuration will be required.

Referring to FIGS. 6a through 6e, stages of fabrication for a semiconductor device, generally shown at 114, are shown. The desire is to create a semiconductor device or wafer 114 that includes pillar structures 116 extending out therefrom perpendicularly whereby a dimension of the pillar structure 116 is on the order of 32 nanometers or less. While it is contemplated that the pillar structure 116 will eventually result in the fabrication of the junction diodes 22 discussed above, the pillar structures 116 may be used for any electronic component or device desired.

In FIGS. 6a through 6e, the bottom layer 118 is a metal conductor. The second layer from the metal conductor 118 is a layer of silicon 120. The silicon layer 120 is a layer used to create the junction diodes 22. Above the silicon layer 120 is a layer of hard mask 122. And finally, above the layer of hard mask 122 is a layer of photoresist 124. As semiconductor wafers 114 are processed, portions of layers or complete layers will be removed. Therefore, not all of the layers discussed above are shown in every Figure. In addition, the silicon layer 120 is a compilation of a plurality of regions that are doped differently to create the desired electrical effects in the pillar structures 116.

Figures 6A, 6B, 6C, 6D, 6E, 7:
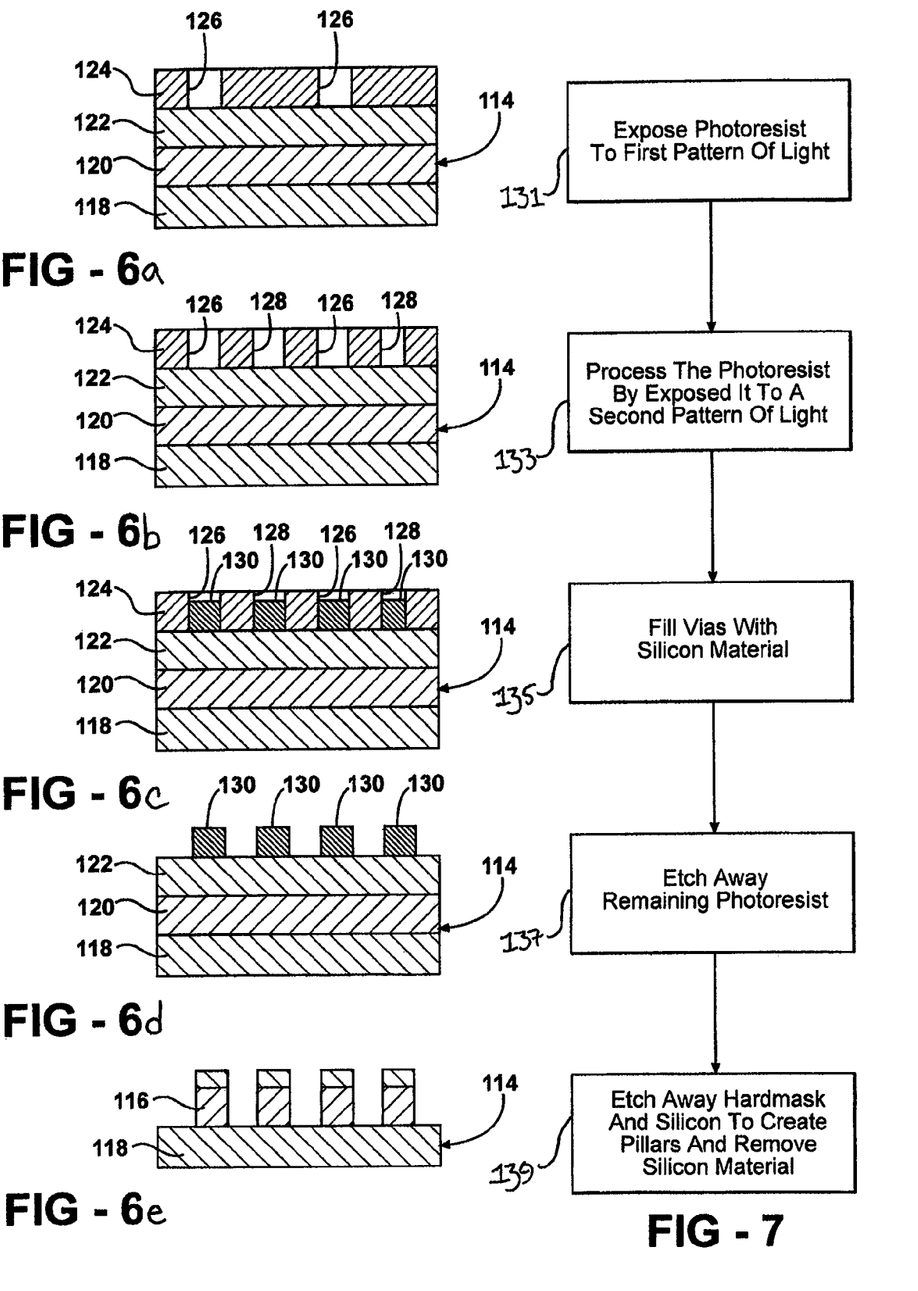
FIGS. 6a through 6e are cross-sectional side views of a semiconductor wafer illustrating steps in the process of forming pillar structures.
FIG. 7 is a flow chart of the steps used in the method illustrated in FIGS. 6a through 6e.

Referring specifically to FIG. 6a, the semiconductor wafer 114 is shown with a portion of photoresist 124 removed. The photoresist layer 124 is acting as a positive resist whereby the method creates holes or vias 126 therein. Due to the limitations of the immersion tool and, hence, the exposure pattern, the dimensions of the vias 126 are small enough to use to create the pillar structures 116. The capabilities of the immersion tool are not, however, satisfactory in that the vias 126 are disposed from each other a distance greater than that which is desired.

Referring to FIG. 6b, it is shown that the layer of photoresist 124 includes a second set of holes or vias 128. The second set of vias 128 were created during a processing step wherein the photoresist pattern is processed further in the layer of photoresist 124. This processing step occurs after the step of exposing the layer of photoresist 124 for the first time to create the first set of vias 126. This processing step to create the second set of vias 128 occurs prior to the step of etching (steps 131 and 133 in FIG. 7) and thus reduces the dimensions of the photoresist pattern in the layer of photoresist 124. A second pattern of light is used to form the second set of vias 128. As alluded to above, this second pattern of light may be identical to the first pattern of light used to create the first set of vias 126 whereby the second pattern of light is merely displaced spatially from where the pattern of light was first shown to create the first set of vias 126. Alternatively, the second pattern of light may be a completely different pattern to render the desired resolution in the resulting pattern of vias 126, 128.

Referring to FIG. 6c all of the vias 126, 128 are filled with a silicon material 130 (step 135 in FIG. 7). After the silicon material 130 has filled the vias 126, 128, the layer of photoresist 124 is etched away at 137. This step is shown in FIG. 6d. The silicon material 130 is used to protect the formation of the pillar structures 116 when the layer of hard mask 122 and the silicon layer 120 are etched. Once the pillar structures are formed, the silicon material 130 is removed. These two steps, step 139 in FIG. 7, represent the transition between the semiconductor wafer 114 in FIG. 6d and the semiconductor wafer 114 in 6e.

The silicon material 130 used is selected to provide additional dimensional control over the resulting pillar structures 116. In the embodiment discussed above, the vias 126, 128 define a CD that is almost as small as is desired. By way of example, where the desired CD is 32 nanometers, the vias 126, 128 reach a CD in the range of 35 nanometers to 45 nanometers. The silicon material 130 is used to take the dimensions provided by the vias 126, 128 and further shrink them to the desired dimension.

The silicon material 130 is a siloxane based Spin-On Glass (SOG). As is shown below, these SOGs are composed of a silicon-oxide caged structure suspended in a casting solvent, and are designed to form an oxide-like film with very good coating and via-filling properties. When baked, the SOG material 130 shrinks through a hydrolysis reaction that removes the hydroxyl group (OH) to form water as a byproduct, thereby condensing the SOG and forming a highly cross-linked network of Si—O chains that can be used as a hard mask for subsequent pillar structure etching. The formed oxide also selectively aligns to the predefined resist from the double exposure and can be easily removed in a buffered HF solution. The shrinking of the SOG in the vias 126, 128 creates a hard mask type structure in the vias 126, 128 that has a CD less than the CD of the vias 126, 128.

The SOG material 130 includes organic end groups, depicted by R, to improve the coating and film tensile stress properties. The organic end groups consist of $CH_3$ or $C_2H_5$ derivatives. It should be appreciated by those skilled in the art that variations of theses compositions can also be used. Other examples may include functional end groups that take the form of acid-cleavable or acid generating compounds The range of viscosity of these organic groups is designed to enhance the via-filling properties to create as uniform a via-filled hard mask as possible, while maintaining the strength of the SOG to withstand subsequent etching steps. In one embodiment, the SOG Material 130 is comprised of approximately 10% to 50% silicon. In some instances, the silicon level will be greater than 50%. It is the level of silicon that is incorporated into the backbone polymer chain that determines the etch rate in the oxygen plasma. Too much silicon may lead to other undesirable properties, such as defects and performance tradeoffs. The organic end groups are used to improve film coating properties and to reduce the tensile stress of the SOG material 130, which minimizes cracking. The ideal SOG material 130 is one that flows easily and fills small openings. While the percentage of organic material is designed to produce an SOG with high stress properties to reduce cracking, it is also capped so as to prevent the SOG material 130 from bonding to the photoresist, which would adversely affect subsequent etch steps.

Referring to FIG. 7, the steps discussed above are set forth as each affects the semiconductor wafer 114 in FIG. 6a through 6e. The steps in FIG. 7 are disposed adjacent the steps shown occurring to the semiconductor wafer 114 in a direct relationship.

Referring to FIGS. 8a through 8d and FIG. 9, a first alternative method for reducing the dimensions of the pillar structures on a semiconductor wafer 214 are shown, wherein like structures have reference numerals offset from the first embodiment discussed by 100. In summary, a layer of photoresist 224 extends over a layer of hard mask 222, which in turn is deposited over a layer of silicon 220. A metal conductor layer 218 extends below the silicon layer 220.

Figure 8A:
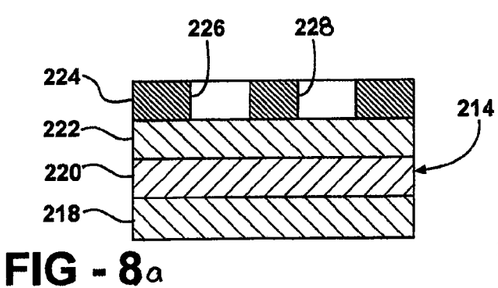
FIGS. 8a through 8d are cross-sectional side views of a semiconductor wafer illustrating steps in a first alternative embodiment of the inventive method.
Figure 8B:
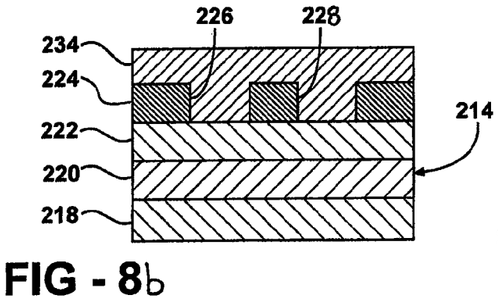

In the first step 232 (FIG. 9), the layer of photoresist 224 is exposed to the first and second patterns of light. The result of this is the formation of the vias 226, 228. As with the embodiment discussed above, the exposure of the layer of photoresist 224 by the patterns of light is considered the first processing step of the semiconductor wafer 214. This embodiment differs from the first embodiment in that the second step of processing the photoresist pattern includes the step of applying a non-conducting coating over the photoresist pattern, including the filling of the vias 226, 228. Therefore, as distinguished from the first embodiment, the SOG material 130 is not yet applied to the semiconductor wafer 214.

Figure 8C:
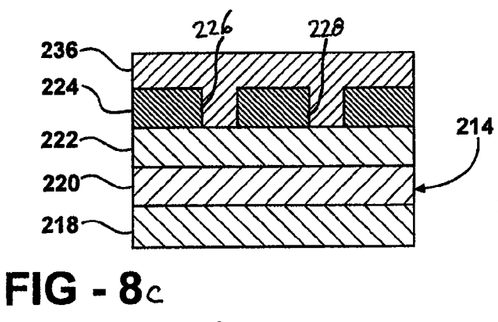
Figure 8D:
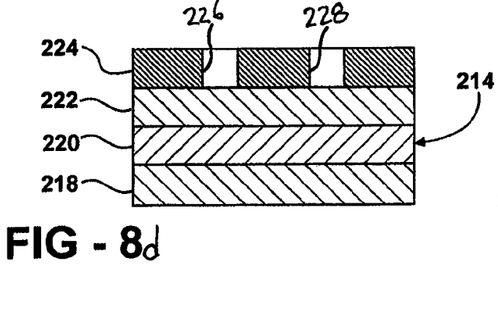
Figure 9:
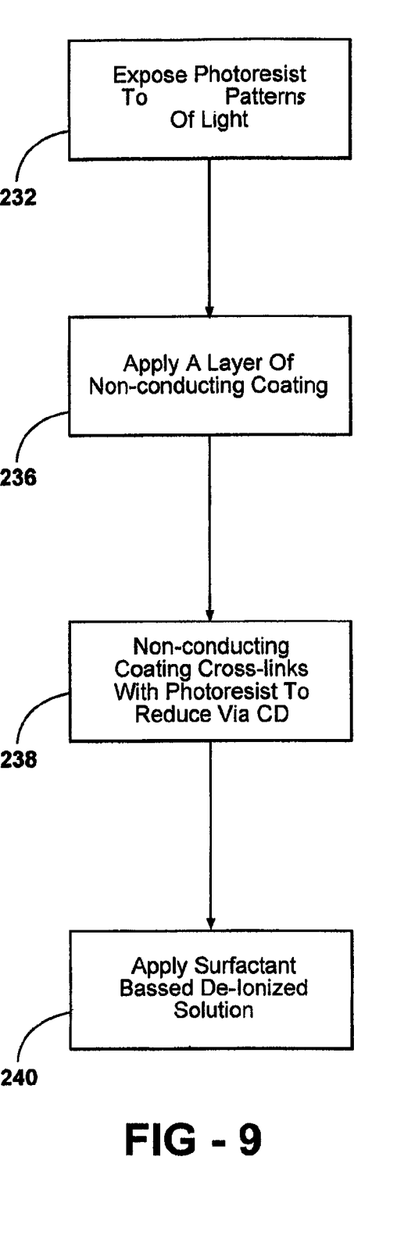
FIG. 9 is a flow chart illustrating the steps of fabricating the structures illustrated in FIGS. 8a through 8d.

The non-conducting coating 234 is formed of a material that will crosslink with the photoresist layer 224. The application of the non-conducting coating 234 at 236 (FIG. 9) results in the reduction of the photoresist CD. This step 236 is also represented in FIG. 8c with the dimensions of the vias 226 being reduced. The amount of cross-linking that may occur between the non-conducting coating 236 and the layer of photoresist 234 depends largely upon how long the non-conducting coating 236 is in contact with the layer of photoresist 224 and the temperature at which the semiconductor wafer 214 is. One such non-conducting coating that may be used in this embodiment is sold by AZ Electronic Materials, under license from Mitsubishi Chemicals. This product is sold under the trademark RELACS®. RELACS® works by selectively reacting with the residual acids in the layer of photoresist 224 to form a layer of cross-linked material that effectively reduces the distance between adjacent features. By way of example, RELACS® may be used for a one minute time period at a temperature in the range of 140 C and 180 C. It should be appreciated by those skilled in the art that if the composition of RELACS®, or any other non-conducting coating 236, is changed by the supplier, the ranges of time and temperature may change as well.

Once the cross-linking is complete, a surfactant based deionized solution is applied at 240 to remove the non-conducting coating 236 that remains uncross-linked to the layer of photoresist 224. With some newer grades of RELACS®, deionized water (DI water) is all that is needed to remove the non-conducting coating that remains uncross-linked. From this stage, the method is identical to the process set forth in the preferred embodiment at a point represented by FIG. 6c and step 135 in FIG. 7 where the vias 226 are filled with silicon material (130 in FIGS. 6a through 6e). Therefore, these steps, while used to complete this first alternative embodiment, are not shown here for purposes of simplifying the disclosure. After this step, the photoresist will be etched away and the etching of the silicon and the hard mask to create the pillar structures 116 is performed to complete the formation of the pillar structures 116.

Figure 10A:
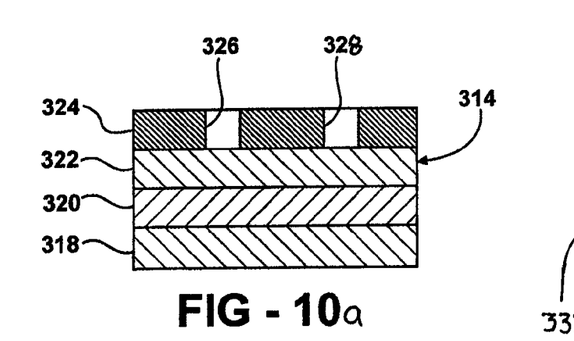
FIGS. 10a and 10b are cross-sectional side views of a semiconductor wafer as it moves through steps in a second alternative embodiment of the inventive method.
Figure 10B:
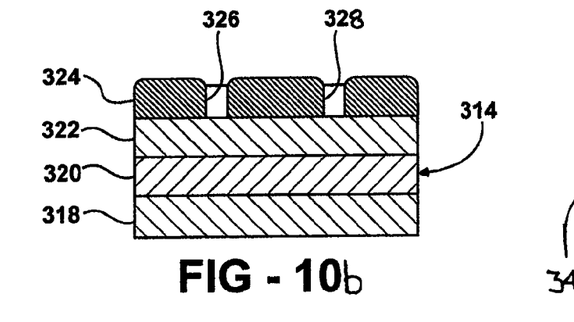
Figure 11:
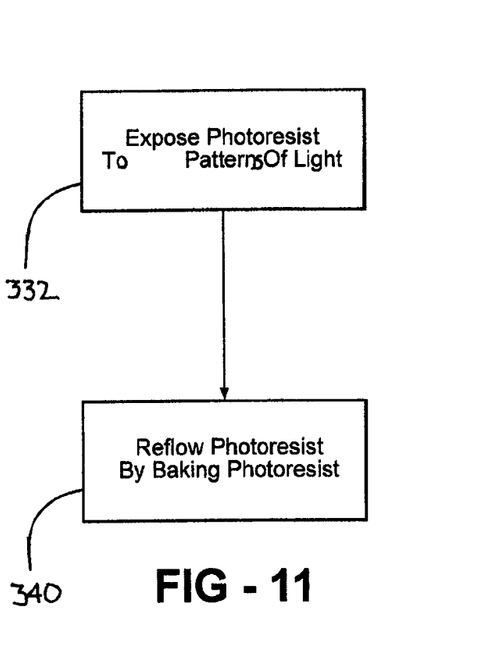
FIG. 11 is a flow chart of the steps taken to create the devices illustrated in FIGS. 10a and 10b.

Referring to FIGS. 10a, 10b and FIG. 11, a second alternative embodiment of the invention is shown. In this embodiment, reference numerals are offset by 200 from the first embodiment shown for like structures. In this embodiment, the first step of processing the layer of photoresist 324 includes the exposure of the layer of photoresist 324 with the first and second patterns of light at 332 to create the vias 326, 328. Once the vias 326, 328 are created, the layer of photoresist 324 is reflowed at 340 in FIG. 11. The photoresist layer 324 is reflowed by applying a temperature to the semiconductor wafer 314 at an elevated temperature that is just above the glass transition temperature of the polymer used to fabricate the photoresist. By way of example, a temperature in the range of 150 C and 180 C for a time period in the range between one and two minutes would provide the adequate reflow of the photoresist to sufficiently reduce the CD to the desired dimensions. This temperature is a temperature that is high enough to allow the photoresist layer 324 to flow again, but low enough not to burn the photoresist layer 324 to the point of pure rigidity. This method is desirable because it adds no new materials to the process and only requires the elevation of temperature of the photoresist layer 324 in order to reduce the CD of the vias 326, 328 through a reflow process.

Once the CD of the vias 326, 328 is reduced, the method like the first alternative embodiment, is identical to the process set forth in the preferred embodiment and returns to the steps illustrated in FIGS. 6c through 6e and steps 135-139 in FIG. 7. The method then continues through the steps identified in FIGS. 6c, 6d and 6e for the formation of the pillar structures 116.

Referring to FIGS. 12a through 12f and FIG. 13, a third alternative embodiment of the method to reduce the CD of the pillar structures 416 is shown. This embodiment is a method that is the inverse of the previous embodiments. In these Figures, the similar structures from the first embodiment are offset by 300. Similar to the first embodiment, the layer of photoresist 424 is exposed to first and second patterns of light at 432. Once the vias 426, 428 are created from the exposure of the photoresist layer 424 by the patterns of light, the SOG material 430 is applied over the vias 426, 428 and the layer of photoresist 424 at 435. The application of the SOG material 430 is the first substep in the step of processing the semiconductor wafer 414 after the exposure of light to the photoresist layer 424.

Figures 12A, 12B, 12C, 12D, 12E, 12F, 13:
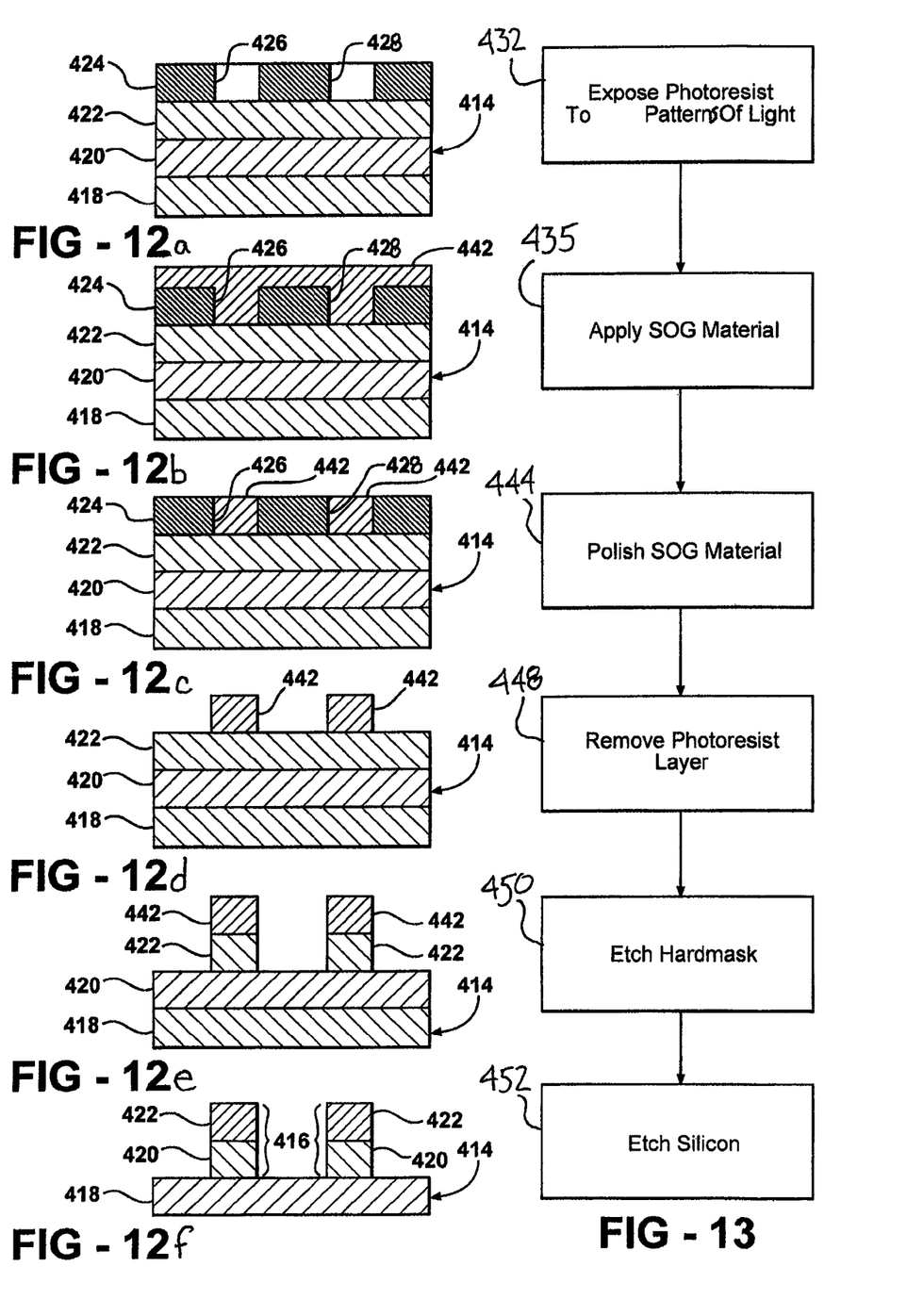
FIGS. 12a through 12f are cross sectional side views of a semiconductor wafer as it moves through the steps in the process of forming elements using a third alternative embodiment of the inventive method.
FIG. 13 is a flow chart illustrating the steps taken as the semiconductor wafer is processed using the alternative method illustrated in FIGS. 12a through 12f.

The SOG material 430 is polished back with a CMP process at 444. This step, represented at 446 in FIG. 13, exposes the layer of photoresist 424. Once exposed, the photoresist layer 424 is removed at 448. The photoresist layer 424 is removed in an asher process, which allows the SOG material 430 that filled the vias 426, 428 to remain. Using the SOG material 430 as a basis, the layer of hard mask 422 is etched away at 450 everywhere but underneath the SOG material 430. With all but the desired hard mask layer 422 removed, the pillar structures 416 are formed by etching the silicon thereunder at 452. This etch process also removes the SOG material 430, as is represented in FIG. 12f.

Throughout this description, one layer has been described as being "above" or "below" another. It will be understood that these terms describe the position of layers and elements relative to the substrate upon which they are formed, in most embodiments a monocrystalline silicon wafer substrate; one feature is above another when it is farther from the wafer substrate, and below another when it is closer. Though clearly the wafer, or the die, can be rotated in any direction, the relative orientation of features on the wafer or die will not change. In addition, the drawings are purposefully not shown to scale and are merely representative of layers and processed layers.

The invention has been described in an illustrative manner. It is to be understood that the terminology, which has been used, is intended to be in the nature of words of description rather than of limitation.

Many modifications and variations of the invention are possible in light of the above teachings. Therefore, within the scope of the appended claims, the invention may be practiced other than as specifically described.

We claim:
1. A method of making a pillar structure, comprising:
providing a positive resist layer over at least one underlying layer;
exposing the resist layer through a mask a first time;
forming a first set of holes in the photoresist layer after exposing the resist the first time;
exposing the resist layer through a mask a second time after the step of forming the first set of holes; and
forming a second set of holes in the resist layer after exposing the resist the second time;
narrowing the first and the second sets of holes;
thereafter forming a filler material in the first and the second sets of holes;
removing the resist layer to leave a filler material pattern over the at least one underlying layer; and
etching the at least one underlying layer using the filler material pattern as a mask to form a plurality of pillars in the at least one underlying layer.

2. The method of claim 1, wherein the at least one underlying layer comprises at least one semiconductor layer.

3. The method of claim 2, wherein:
the at least one semiconductor layer comprises a p-type silicon layer and an n-type silicon layer; and
each of the plurality of pillars comprises a diode.

4. The method of claim 3, wherein:
each of the plurality of pillars has a cylindrical shape;
each of the plurality of pillars comprises a non-volatile memory cell comprising the diode and a resistivity changing element; and
each of the plurality of pillars is located in a monolithic three dimensional non-volatile memory array.

5. A method of making a pillar structure, comprising:
providing a positive resist layer over at least one underlying layer;

exposing the resist layer through a mask a first time;
exposing the resist layer through a mask a second time; and
forming holes in the resist layer after exposing the resist the first and the second time;
narrowing the holes;
thereafter forming a filler material in the holes;
removing the resist layer to leave a filler material pattern over the at least one underlying layer; and
etching the at least one underlying layer using the filler material pattern as a mask to form a plurality of pillars in the at least one underlying layer.

6. The method of claim 5, wherein the at least one underlying layer comprises at least one semiconductor layer.

7. The method of claim 6, wherein:
the at least one semiconductor layer comprises a p-type silicon layer and an n-type silicon layer; and
each of the plurality of pillars comprises a diode.

8. The method of claim 7, wherein:
each of the plurality of pillars has a cylindrical shape;
each of the plurality of pillars comprises a non-volatile memory cell comprising the diode and a resistivity changing element; and
each of the plurality of pillars is located in a monolithic three dimensional non-volatile memory array.

* * * * *